United States Patent
Liu et al.

(10) Patent No.: US 6,300,632 B1
(45) Date of Patent: Oct. 9, 2001

(54) UNCOOLED INFRARED FOCAL PLANE IMAGER AND MICROELECTROMECHANICAL INFRARED DETECTOR FOR USE THEREIN

(75) Inventors: Chien-Chang Liu, San Jose, CA (US); Carlos H. Mastrangelo, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 09/418,391

(22) Filed: Oct. 14, 1999

(51) Int. Cl.[7] .............................. G61J 5/20; H01L 27/14; H01L 31/00
(52) U.S. Cl. .................................. 250/338.4; 250/336.1; 250/338.1; 250/352
(58) Field of Search .............................. 250/338.4, 338.3, 250/338.2, 338.1, 336.1, 337, 330, 332, 333, 370.01, 370.14, 370.15, 352

(56) References Cited

U.S. PATENT DOCUMENTS

| | | |
|---|---|---|
| 5,023,431 | 6/1991 | Roberge . |
| 5,369,280 | 11/1994 | Liddiard . |
| 5,374,123 | 12/1994 | Bu . |
| 5,381,296 | 1/1995 | Ekeland et al. . |
| 5,441,343 | 8/1995 | Pylkki et al. . |
| 5,450,053 | 9/1995 | Wood . |
| 5,523,564 | 6/1996 | Yamada et al. . |
| 5,554,849 | 9/1996 | Gates et al. . |
| 5,600,174 | 2/1997 | Reay et al. . |
| 6,249,002 | * 6/2001 | Butler .................. 250/338.4 |

* cited by examiner

*Primary Examiner*—Hung Xuan Dang
(74) *Attorney, Agent, or Firm*—Brooks & Kushman P.C.

(57) ABSTRACT

An uncooled infrared imager and associated microelectromechanical infrared detectors based on an active pixel heat balancing technique are disclosed. The imager is fabricated using a commercial CMOS process plus a simple electrochemical etch stop releasing step. The basic active pixel detector structure consists of a simple cascode CMOS amplifier in which the PMOS devices are built inside a thermally-isolated floating n-well. The intrinsic coupling of the cascode currents with the self-heating of the well forms an electrothermal feedback loop that tends to maintain the well temperature constant. By employing the heat balance between incoming infrared radiation and the PMOS device power dissipation, the responsivity of the detector is controlled by the cascode biasing current.

20 Claims, 7 Drawing Sheets

UNCOOLED INFRARED FOCAL PLANE IMAGER AND MICROELECTROMECHANICAL INFRARED DETECTOR FOR USE THEREIN

TECHNICAL FIELD

This invention relates to an uncooled infrared focal plane imagers and microelectromechanical infrared detectors for use therein.

BACKGROUND ART

Bolometers are thermally isolated detectors that are heated by infrared radiation absorbed on their surface. The temperature rise is converted to an electrical signal using a thermistor element. Infrared bolometer detectors are widely used for thermal targeting, night vision systems, and motion sensing. The most sensitive bolometers available are cryogenically cooled superconductive devices. Often their cooling system is heavy and bulky; hence these devices are not adequate for lightweight and portable systems. In addition, the cryogenic cooler is the most expensive component in the photon detector IR camera, and has finite lifetime only around 2,000 hours.

Recent work by Honeywell and Texas Instruments has demonstrated the feasibility of uncooled bolometric devices. Honeywell's device used a micromachined array of microbridge-type bolometric pixels 50×50 $\mu m^2$ each. The temperature detector was a $VO_x$ resistor patterned on the microbridge which has a sharp transition in its resistance near room temperature. Similar technology has been applied into different developed commercial available infrared imagers. The Texas Instruments device uses a pyroelectric pixel of barium strontium titanate (BST) that is patterned directly on the substrate. Both devices have a backplane of interfacing electronics for multiplexing of the pixel signals. Recently, the research work has been concentrating on the monolithic fabrication of infrared detector using micromachining techniques which trade the fill factor with potential high yield and lower production cost.

In all of these technologies, the infrared detectors have highly process dependent responsivities and offsets requiring elaborate calibration procedures and the extensive use of corrective electronics.

Figure 1:
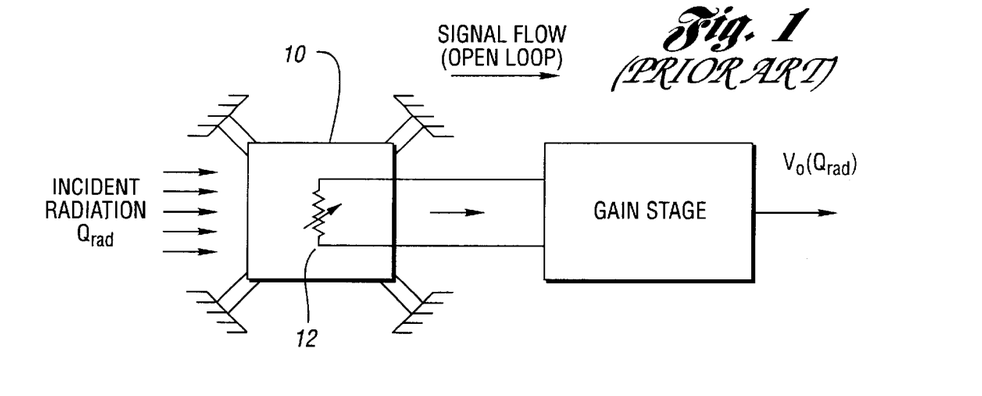
FIG. 1 is a schematic view of a prior art bolometer operating in an open loop fashion.

Most conventional bolometers operate in the open loop scheme shown in FIG. 1. Upon the absorption of incident radiation, the temperature of a thermally isolated plate or absorber 10 increases changing the electrical characteristic of a thermistor 12. The thermally isolated plate 10 defines a thermally isolated area. The electrical signal of the thermistor 12 is typically amplified yielding voltage $V_o$ representing the power of the incoming radiation. One of the major problems with this mode of operation is that the measured signal is influenced by many material properties, offsets and drifts which make the response difficult to predict.

Figure 2:
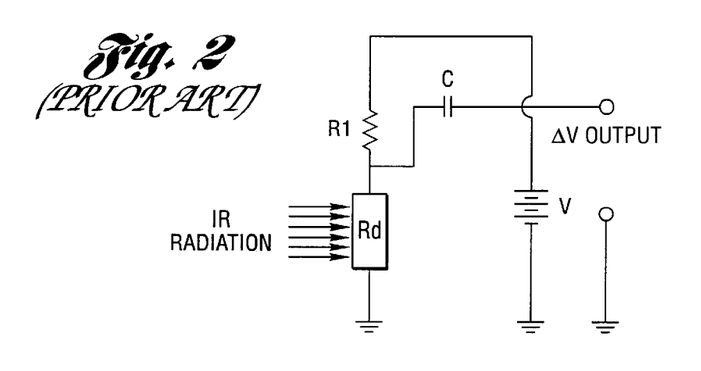
FIG. 2 is a schematic view of a simple open loop bolometer detector circuit.

For example in the simple open loop detector circuit shown in FIG. 2, the bolometer $R_d$ with temperature coefficient of resistance $\alpha$ is connected through biasing resistor $R_1$ to the voltage source V. For incident power $\Delta\Phi$, the bolometer temperature increase $\Delta T_d$ obeys:

$$C\frac{d\Delta T_d}{dt} + G_0\Delta T_d = W_h + \Delta\Phi \quad (1)$$

where:

C=the heat capacitance of the bolometer element;
$G_0\Delta T_d$=the conductive and radiative heat flow for the element; and
$W_h$=the self-generated thermal power in the bolometer.
The responsivity of this detector circuit is:

$$R = \frac{\Delta v}{\Delta \Phi} = \left(\frac{R_1}{R_1+R_d}\right)\frac{I\varepsilon R_d \alpha}{G_e(1+\omega^2\tau^2)^{1/2}} \quad (2)$$

where $$G_e = G - \alpha G_0(\Delta T_d)\left(\frac{R_1-R_d}{R_1+R_d}\right), \tau = C/G_e \quad (3)$$

and
  $G_e$: effective thermal conductance;
  G: thermal conductance for a small temperature change;
  $\varepsilon$: the emissivity of the bolometer; and
  $\omega$: sinusoidal radiation input frequency.

The responsivity thus depends on the material properties like $\alpha$, and $R_d$ that vary from run-to-run hence a calibration procedure is needed. In a focal plane imaging array, this must be done for each pixel in the array.

DISCLOSURE OF INVENTION

An object of the present invention is to provide an uncooled infrared focal plane imager and microelectromechanical infrared detector for use therein wherein both the imager and the detector are heat-balancing.

Another object of the present invention is to provide an uncooled infrared focal plane imager and microelectromechanical infrared detector for use therein wherein both the imager and the detector utilize an active pixel heat-balancing technique based on electrothermal feedback principles.

Yet another object of the present invention is to provide an uncooled infrared focal plane imager and microelectromechanical infrared detector for use therein which are formed utilizing a commercial CMOS process plus a single electrochemical etch stop releasing step.

Yet still another object of the present invention is to provide an uncooled infrared focal plane imager and microelectromechanical infrared detector for use therein which employ heat balance between incoming infrared radiation and active device power dissipation.

In carrying out the above objects and other objects of the present invention, an uncooled infrared focal plane imager is provided. The imager includes a plurality of microelectromechanical infrared detectors disposed in a plane. Each of the infrared detectors includes a substrate and a sensor positioned in an area thermally isolated from the substrate for sensing temperature and to provide a corresponding temperature signal representing incident power of infrared energy. Each of the infrared detectors also includes a heater for controllably heating the sensor based on the temperature signal. A change in incident power of the infrared energy is substantially balanced by a corresponding change in heat generated by the heater to heat the sensor. The imager also includes a signal processor for processing the temperature signals from the infrared detectors to obtain an infrared image.

Preferably, the heater is a circuit element such as a MOSFET and the sensor is a thermistor element such as a MOSFET.

Also, preferably, the substrate is a semiconductor substrate.

Still, preferably, each of the infrared detectors includes a comparator which compares the temperature signal with a reference temperature signal and provides an output signal based on the comparison wherein the heat generated by the heater is based on the output signal.

Preferably, the sensor and heater are PMOS devices and wherein the sensor and the heater comprise stages of a cascade amplifier.

Still further in carrying out the above objects and other objects of the present invention, a microelectromechanical infrared detector constructed in accordance with the above is provided.

The uncooled infrared focal plane imager includes two-dimensional arrays of infrared detectors thermally isolated from their surroundings. The detectors respond to incoming infrared radiation through temperature changes. Materials used for these detectors are chosen based on material properties, such as electrical resistance, pyroelectric polarization, or dielectric constant, each of which are dependent on temperature variations. Uncooled infrared imagers are fundamentally different from the traditional cryogenically cooled, mechanically scanned, linearly arrayed photon detector-based infrared imagers. The uncooled focal plane infrared imaging systems do not have complex moving components and do not require complicated cooling mechanisms and therefore are lightweight, small, have low power requirements, require simplified control logistics, and are more reliable.

The present invention provides a new type of uncooled heat balancing focal plane infrared imager based microelectromechanical system (MEMS) technology suitable for many applications such as night vision for military systems, collision avoidance and vision enhancement for automotive safety systems, and wafer temperature radiometry for semi-conductor process control. Compared to current uncooled infrared imager technology, this invention provides a high performance uncooled infrared imager technology compatible with commercial CMOS processes thus drastically reducing production costs. In addition, the new uncooled infrared imager technology only requires simplified peripheral signal processing circuits while maintaining increased or comparable performance with currently available commercial infrared imaging technology developed separately by Texas Instruments, Inc. and Honeywell, Inc.

Compared to exotic materials and production processes used for other uncooled infrared imaging technology, the temperature dependency of a metal-oxide silicon field enhanced transistor (MOSFET) is used as the infrared sensing mechanism thus allowing the fabrication of the imager using any commercial CMOS 1.2 $\mu$m process (scalable) followed by a simple electromechanical etching post process step. Therefore, the production cost of this new type of heat balancing focal plane infrared imager is drastically lower than the currently available uncooled thermal imager. In addition, this new focal plane infrared imager does not need individual pixel calibration which is required for other uncooled infrared imagers. Consequently, the device calibration cost is much lower than any other type of uncooled infrared imager.

The measured responsivity of the heat balancing detector described herein is $1.2 \times 10^6$ V/Watt while the incoming infrared signal is chopped at 20 Hz. This responsivity performance is the highest reported to date. The measured detectivity is $D^* = 3 \times 10^7$ cm$\sqrt{Hz}$W$^{-1}$ at 30 Hz is comparable to that of commercial detectors. Based on this new heat balancing detection technology, a 8×8 infrared focal plane imager has been designed and fabricated. Initial testing of this prototype imager indicates that the imager responds to the incoming heat sources based on signal locations and magnitudes.

The above objects and other objects, features, and advantages of the present invention are readily apparent from the following detailed description of the best mode for carrying out the invention when taken in connection with the accompanying drawings.

BEST MODE FOR CARRYING OUT THE INVENTION

Figure 3:
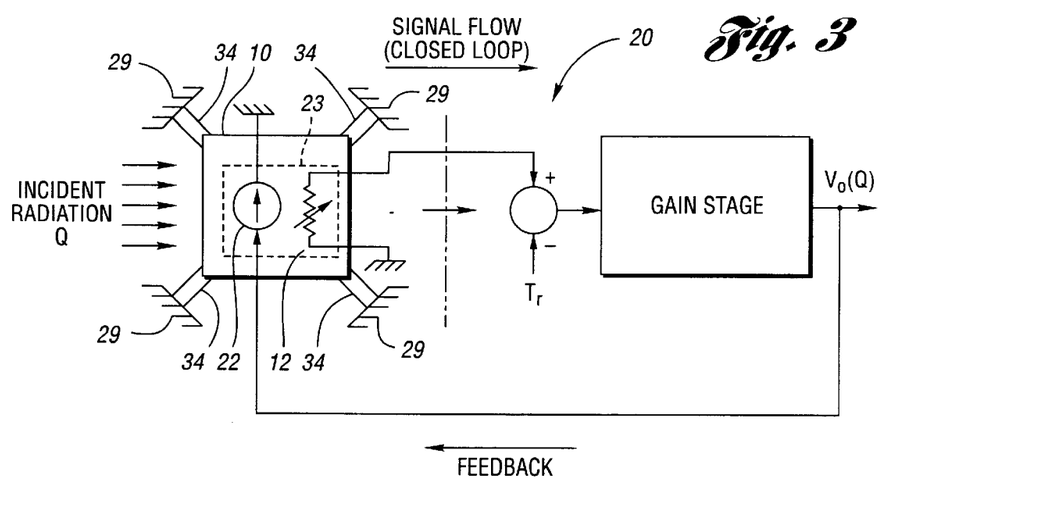
FIG. 3 is a schematic view of a closed-loop system for detecting radiant energy constructed in accordance with the present invention.

Referring now to FIG. 3, there is illustrated a closed-loop detector, generally indicated at 20, for detecting infrared energy and constructed in accordance with the present invention. The detector 20 is substantially identical to the open loop detector of FIG. 1, but further includes a heat balancing circuit element 22 (a heater) together with the thermistor 12 in a thermally isolated area 23 of the absorber or plate 10. The amplified thermistor output powers the balancing heater 22; thus a closed electrothermal feedback loop is established by the thermal coupling of the heater-induced temperature raise and the thermistor response. If the loop gain is high enough, this configuration keeps the detector temperature and the total power of the plate 10 constant. Thus, any increase in the incident power of incoming infrared radiation must be balanced with a corresponding decrease in the electrical power dissipated by the heater 22.

Like the open loop detector of FIG. 1, the closed-loop detector 20 includes a support structure in the form of beams 34 to support the absorber 10, the heater 22, and the thermistor 12 in spaced relationship from a semiconductor substrate 29, thereby isolating these elements from the substrate 29.

If the heater 22 is implemented as a current source, then there is a linear relationship between the voltage of the heater 22 and the incident radiation power. Furthermore, this relationship is set by the heater current. Since the sum of the incident and generated power is constant $$Q_{heater} + Q_{rad} \approx \text{constant} \tag{4}$$

Differentiating Equation (4) and using $Q_{heater} = I_o V_o$ where $I_o$ is constant, one obtains:

$$dQ_{heater} + dQ_{rad} = I_o dV_o + dQ_{rad} = 0 \tag{5}$$

hence the responsivity R of the pixel is:

$$R = \frac{dV_o}{dQ_{rad}} \approx -\frac{1}{I_o} \tag{6}$$

This relationship is independent of any device parameters hence the detector response is well defined. For example, Equation (6) yields a high responsivity of $10^6$ V/W with a 1 $\mu$A heater current. The inverse current relationship can only be obtained if the electrothermal open loop gain is sufficiently high.

Figure 4:
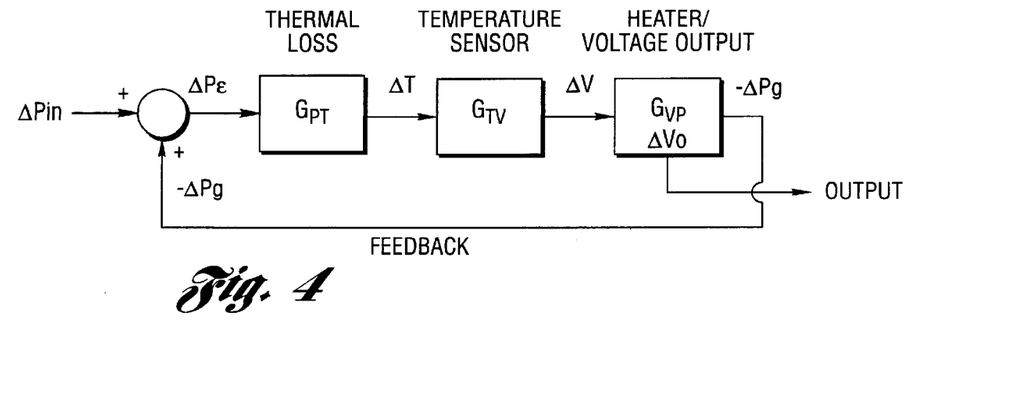
FIG. 4 is a schematic block diagram of an electrothermal feedback loop of the present invention.

The electrothermal loop consists of three different unit conversion stages shown in FIG. 4. Stage $G_{PT}$ converts changes in the detector power $\Delta P_e$ to temperature fluctuations $\Delta T_e$. The thermal loss to the ambient determines the conversion efficiency; hence the higher the thermal isolation the larger $G_{PT}$ is Stage $G_{TV}$ represents a temperature sensor that converts temperature excursions to a voltage signal $\Delta V$. Stage $G_{VP}$ amplifies $\Delta V$ and converts it to a compensating power $-\Delta P_g$ through using a constant current load.

The overall loop gain $\Gamma$ is:

$$\Gamma = G_{PT} \times G_{TV} \times G_{VP} = \frac{\Delta P_g}{\Delta P_e} \tag{7}$$

If $\Gamma 1 \rightarrow \Delta P_e \cong 0 \rightarrow \Delta T \cong G_{PT} \Delta P_e \cong 0$ (8)

A high gain product ensures that the error power $\Delta P_e$ and the temperature difference $\Delta T_e$ are small. However, not all of these terms are large. $G_{PT}$ can be as large as $10^5$ K W$^{-1}$, but for most thermistors $G_{TV}$ is usually just $\approx 10^{-3}$ V K$^{-1}$, and the last term $G_{TP}$ is $$G_{VP} = A_v I_o \approx 10^{-6} A_v \text{WV}^{-1} \tag{9}$$

where $A_v$ is the voltage amplification of the last stage. In order for the loop gain to be substantial, a large $A_v \approx 10^4$ is necessary within each detector. This can be achieved using a CMOS cascode gain stage as explained below.

Thermistor Implementation Using MOSFET

Thermistor elements can be implemented using passive or active devices. Two parameters are important for their use in infrared detectors. First, the temperature coefficient must be as large as possible, and second the element must have a low noise which ultimately determines the minimum detectable signal.

In the detector of the present invention, the choice of thermistor element is constrained to materials and devices that can be built on the n-well of a conventional CMOS process. It can be achieved in a number of ways using resistors or diodes, but eventually the thermistor signal must reach the gate of a fairly high gain MOSFET amplifier. Therefore, one is noise-limited by the MOS device performance with a substantial amount of 1/f noise.

In the detector of the present invention, the same PMOS device is used for thermistor and amplification purposes since the characteristics are temperature dependent. From the simple model for the MOSFET drain current operated in saturation with strong inversion $$I_{DS} = \frac{1}{2} \mu C_{OX} (V_{GS} - V_T)^2 \tag{10}$$

two parameters: threshold voltage $V_T$ and surface mobility $\mu$ in Equation (10) are temperature dependent. The threshold voltage of a PMOS devices can be expressed as follows:

$$V_T = V_{FB} + 2|\phi_p| - \frac{Q_d}{C_{ox}} \tag{11}$$

where $V_{FB}$ is the flat band voltage, $\phi_p$ is the Fermi potential of the p-substrate, $Q_d$ is the charge per unit area contained within the surface depletion region and $C_{ox}$ is the oxide capacitance per unit area. The temperature sensitivity of the threshold voltage can be determined by exploring the temperature effects for each term in the equation listed above. Empirically, the threshold voltage variation from the ambient temperature fluctuation can be approximated modeled by a simple linear function as:

$$V_T(T) = V_T(T_0) - \alpha(T - T_0) \tag{12}$$

where the $\alpha$ is approximately about 1~2 mV/°C. for regular CMOS process fabricated devices. This expression is valid over the range of 200 to 400 K, where $\alpha$ depends on the substrate doping level and the dosage of implants used during fabrication.

In MOSFET, the channel mobility is a strong function of temperature change. The temperature coefficient of surface mobility is empirically extracted as follows:

$$\mu(T) = \mu_0 \left(\frac{T_0}{T}\right)^n \tag{13}$$

The temperature dependence of surface mobility is proportional to $T^{-n}$ where n ranges from 1 to 2.5, depending on the oxide growth condition and temperature range.

The threshold voltage and mobility coefficients tend to cancel each other. Therefore, the temperature coefficient of drain to source current depends on which temperature effect dominates at a given bias point. Further, there is a bias point at which these two effects cancel out resulting in a zero temperature coefficient (ZTC). The ZTC point depends on the size of transistor, oxide thickness, temperature coefficient of threshold voltage and surface mobility.

Figure 5:
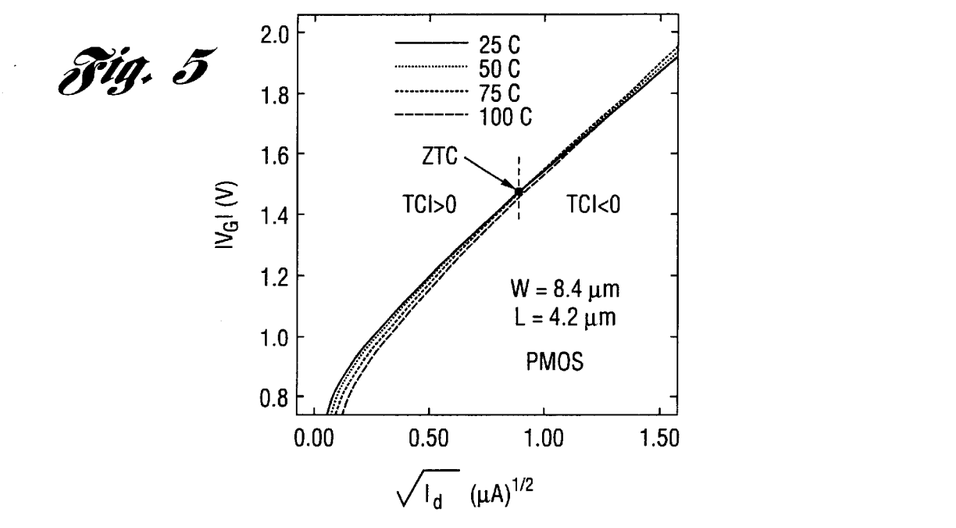
FIG. 5 is a graph illustrating PMOS current dependence vs. temperature.

FIG. 5 shows the I-V-T characteristics of a PMOS deice (L=4.2 $\mu$m, W=8.4 $\mu$m) using a MOSIS 1.2 $\mu$m n-well HP CMOS process current over the temperature range from 25° C. to 100° C.

The plot shows a ZTC at about 1 $\mu$A.

Basic Detector Circuit

Figure 6:
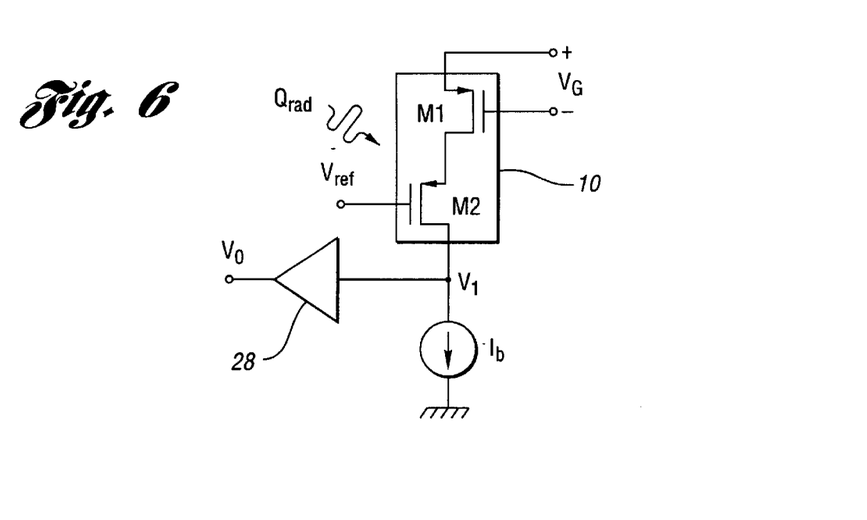
FIG. 6 is a schematic view of a basic heat balancing bolometer constructed in accordance with the present invention.

FIG. 6 shows the basic implementations of the heat balancing bolometer of the present invention. M1 is the thermistor element, M2 is the heater, and the combination of M1 and M2 form a cascode amplification stage and heater. Both devices are placed on a thermally isolated well 10 suspended by a support structure such as oxide-isolated polysilicon beams 34 that also carry electrical leads to the chip substrate 29. A buffer 28 is located between $V_0$ and $V_1$.

Figure 7:
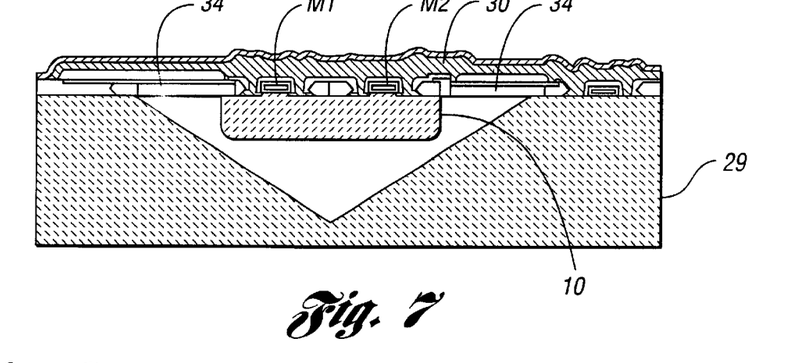
FIG. 7 is a schematic sectional view of a typical detector constructed in accordance with the present invention.

FIG. 7 shows a schematic of the typical detector structure having a p-silicon substrate 29. PMOS devices M1 and M2 are covered by a layer 30 of a second metal used as a light shield for suppressing any photo effect. The detector absorber layer is realized using the second metal layer covering the plate or n-well region 10. The plate 10 is supported by the oxide-isolated poly beams 34. This metal is covered by silicon nitride and oxynitride passivation layers. This type of absorber can typically achieve a 20%~30% absorptivity.

Referring again to FIG. 6, the detector circuit is biased by current $I_b$ in a regime that makes the temperature coefficient of current in M1 positive (i.e., $I_b \leq 1$ $\mu$A). This current also determines the detector responsivity. In order to achieve a high loop gain, gate bias voltages $V_G$ and $V_{ref}$ are adjusted such that both transistors M1 and M2 are in saturation.

A small but significant bias power $(V_{dd}-V_1)I_b$ is dissipated on the well 10; therefore the well temperature normally rests at 1–5° C. higher than the substrate 29.

Upon the absorption of radiation, the well temperature increases causing the threshold voltage of M1 to decrease; hence the current of M1 tends to increase. However, the current through M1 and M2 cannot exceed $I_b$. Therefore, the circuit responds by pulling up voltage $V_1$ instead decreasing the power dissipation of M1 and M2 and reducing the temperature of the well 10 close to its original value. If the loop gain is large enough the responsivity $R=I_b^{-1}$.

Detector Noise

Figure 8:
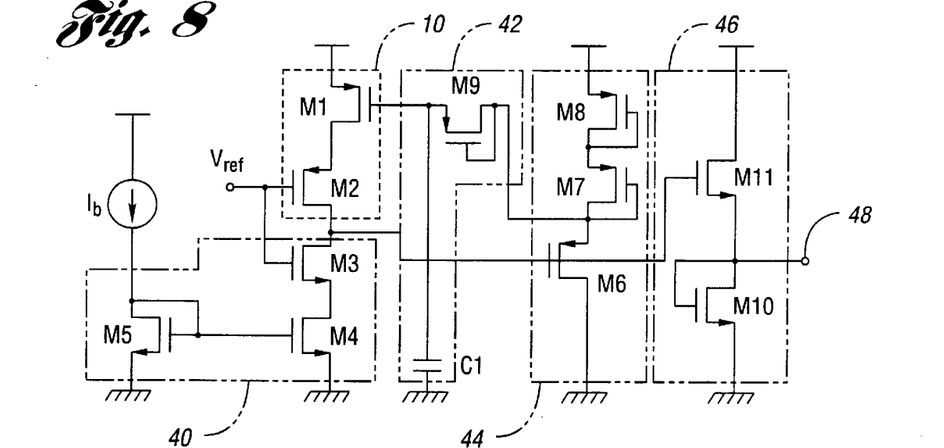
FIG. 8 is a schematic circuit diagram of the detector of the present invention.

If current source $I_b$ is implemented with a cascode NMOS current mirror as shown in FIG. 8, the input noise equivalent power (NEP) for this detector is:

$$NEP^2 \approx \overline{\Delta\Phi^2} + \frac{(2\overline{v_n^2} + \overline{v_p^2})}{R^2} \qquad (14)$$

where $\Delta\Phi^2$ is the mean square fluctuation in radiation power, and $v_n^2$ and $v_p^2$ are the input referred noise equivalent voltages of the M5–M4 NMOS and M1 PMOS devices.

The mean power fluctuation is just a function of the operating temperature $T_d$ and thermal conductance $G_{th}$ of the thermally isolated detector (and plate):

$$\overline{\Delta\Phi^2} = 4k_B T_d G_{th} \Delta f \qquad (15)$$

where $k_B$ is Boltzmann's constant, and $\Delta f$ is the measurement bandwidth. In general, for the structure of FIG. 6, the NEP is dominated by the 1/$f$ MOSFET noise:

$$\overline{v^2}(f) \approx \frac{K_f}{2\mu C_{ox}^2 WLf} \Delta f \qquad (16)$$

where $\mu$, $C_{ox}$, W, and L are the mosfet mobility, gate capacitance per unit area, width and length, respectively. Therefore, to minimize the NEP, M1–M5 should be made as large as possible.

Biasing

Any practical implementation of the detector of FIG. 6 requires additional bias stabilization circuits for several reasons. First, because of the high cascode gain the gate voltage of M1 should be precisely adjusted to maintain M1 and M2 in saturation. Second, once a proper $V_{G1}$ is determined, any excursion of the substrate temperature would upset the current balance moving M1 out of saturation.

The stabilization of the bias point is accomplished with the circuit shown in FIG. 8. Transistors M3–M5 form the bottom half of the cascode and a current mirror or current control circuit 40 for setting $I_b$. Bias $V_{ref}$ is set to about $V_{dd}/2$, and gate voltage $V_{G1}$ is generated by MOSFETs M6–M9. M9 forms part of an LPF 42, and M6, M7, and M8 form part of a bias stabilization circuit 44. These transistors monitor $V_1$ cutting off M1 if $V_{dd}-V_1<2|V_{TP}|$. This maintains M1 and M2 in saturation if $V_{GS_1}$ and $V_{GS_2}$ are small.

The stabilization circuit 44 must track variations on gain, threshold voltage, and substrate temperature, but it should riot interfere with the incoming infrared signal. The signal isolation is implemented by the insertion of a low frequency pole which shorts out the stabilization loop at high signal frequencies. The modulation of the radiation is also beneficial to remove much of the 1/f noise present in the MOSFETs.

M10 and M11 form a buffer 46 wherein a measurement output 48 is provided.

Figure 9:
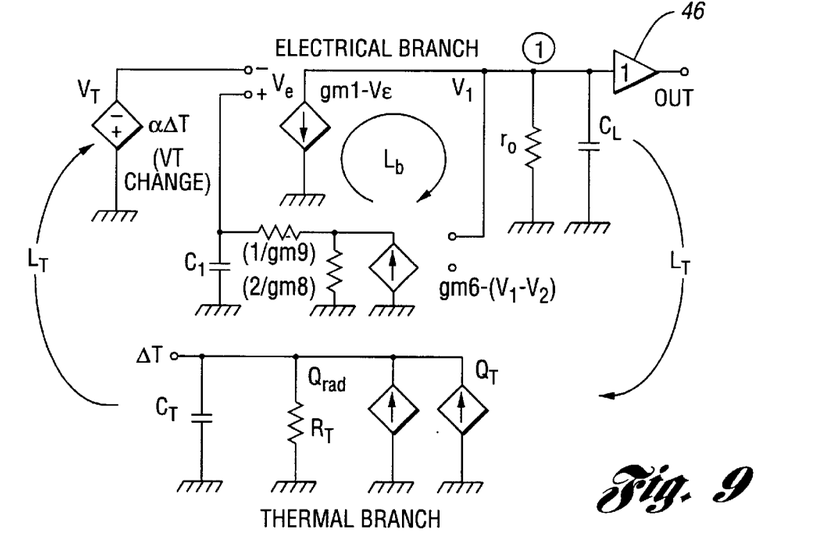
FIG. 9 is a schematic view of an equivalent, small-signal electrothermal circuit.

The frequency response of the detector circuit is calculated from the equivalent electrothermal network of FIG. 9. Source $v_T=\alpha \Delta T$ represents the change in $V_{TP}$ with well temperature, $gm_1$ and $r_o$ are the transconductance of M1 and the output impedance at node (1). Source $Q_T=I_b v_1$ represents changes in well power dissipation, and $R_T$ and $C_T$ are the thermal resistance and capacity of the suspended well. The error voltage $v_\epsilon$ represents small signal changes to $V_{GS1}$.

The circuit has two feedback loops. The electrothermal loop $L_T$ involves $\Delta T$ and determines the responsivity. The bias stabilization loop $L_b$ involves $gm_6$ and the shorting pole introduced by $gm_9$ and $C_1$. The response of the circuit at a particular frequency is dominated by the loop with the largest gain. The ratio of open loop gains is:

$$\frac{\Gamma_T}{\Gamma_b} \approx \frac{\alpha I_b R_T gm_8 (1 + sC_1/gm_9)}{2gm_6 (1 + sR_T C_T)} \qquad (17)$$

$$\approx 10^{-4} \frac{gm_8 (1 + sC_1/gm_9)}{2gm_6 (1 + sR_T C_T)} \qquad (18)$$

Therefore, in order to short the bias loop, $gm_6 \ll gm_8$, or the frequency separation between pole $gm_9/C_1$ and the chopped radiation signal must be high. Achieving the latter is difficult because it is difficult to obtain a pole below about 0.1 Hz with on-chip components. Further, the high frequency response is dominated by the loading capacitance at node (1) and the thermal capacitance of the suspended well 10. This limits the maximum signal frequency to about 100 Hz, and the maximum separation to roughly three orders of magnitude.

Alternatively, the voltage required to stabilize the detector bias can be stored in $C_1$ momentarily under open loop conditions. This is the approach used in the actual imager discussed hereinbelow.

Fabrication

An infrared detector was constructed by releasing the n-well as shown in FIG. 7 using an electrochemical etch stop technique described by Reay in the paper entitled "Thermally and Electrically Isolated Single Crystal Silicon Structures in CMOS Technology," IEEE ELECTRON DEV. LETT., vol. 15, pp. 399–401, 1994. First, conventional CMOS chips were fabricated using the HP 1.2 $\mu$m CMOS MOSIS process. The etch opening is accomplished by superimposing active, contact, via and pad openings in a conventional CMOS layout. The chips were next diced and wire bonded to DIP ceramic packages. The etch release was done by immersion of the packaged chips into the electrochemical etch bath.

The etching solution was 10 wt. % tetramethyl ammonium hydroxide (TMAH) with water solution enriched with dissolved silicon. The silicon rich TMAH solution is an anisotropic etchant that penetrates the substrate through the openings undercutting the well. After releasing the well, the etch stops at the <111> silicon crystal planes without attacking the exposed aluminum metal lines.

A four terminal electrochemical etch stop method was used to prevent the n-well being attacked by the etching solution. The N-well was biased at –0.8 V versus etching solution and the p-type substrate was biased at –1.5 V with a potentiostat (EG&G 362). A solid Ag/AgCl reference electrode (In Vivo Metric E271S) was used as the reference electrode and the platinum foil was the counter electrode in conducting the needed current to maintain the potential difference. After the etch, the packaged samples were thoroughly rinsed in DI water and tested.

Figures 10, 11:
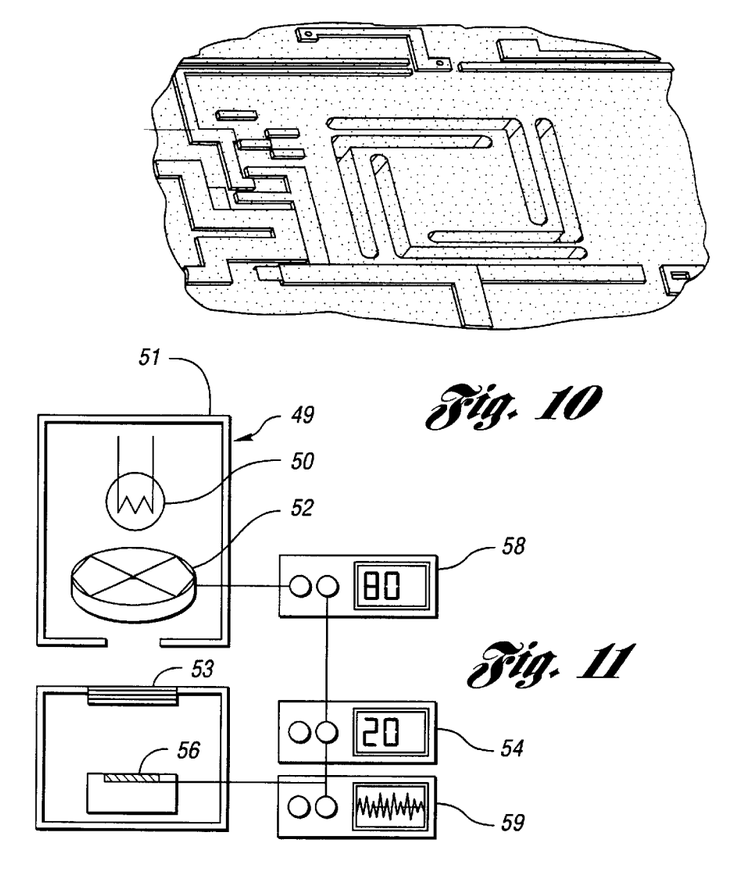
FIG. 10 is a schematic perspective view, partially broken away, of a suspended detector well of the detector.
FIG. 11 is a schematic view of an experimental apparatus used to measure responsivity of the imager of the invention.

FIG. 10 shows a photograph of a 28×42 $\mu$m$^2$ detector well suspended by four 56×5 $\mu$m$^2$ oxide passivated polysilicon beams which serve as interconnect lines from the well to the substrate. A metal plate covers the suspended well PMOS devices to suppress any photoresponse. The 8-transistor, 109×109 $\mu$m$^2$ pixel was released in a TMAH mixture of 10 wt. % heated at 80° C. for 1–1.5 hours.

Characterization

The devices were tested in the setup shown in FIG. 11 consisting of a light source 49, a light chopper 52, an infrared filter 53 and a SR830 lock-in amplifier 54 (Stanford Research Instruments). The light source 49 included an incandescent bulb 50 enclosed inside a metal case 51 with a silicon window. The radiance of the light source 49 was measured using a Molectron P-42 pyroelectric detector 56 calibrated using an 835 nm SpectraDiode labs laser diode and a Newport 1815-C power meter. The chopper 52 was controlled by a controller 58. An oscilloscope 59 was also provided. Initial measurements show responsivities of R$\approx$0.3–1.1×10$^6$ V/W at atmospheric pressure with a noise equivalent power NEP/$\sqrt{\Delta f}$<3×10$^{-10}$ W/$\sqrt{Hz}$. For these measurements the bias stabilization circuit was implemented using an external op-amp and filter. The normalized detectivity was:

$$D^* = \frac{(A_d \Delta f)^{1/2}}{NEP} \quad (19)$$

where $A_d$ is the detector area. The measured detectivity of D*=3×10$^7$ cm $\sqrt{Hz}$ W$^{-1}$ at 30 Hz is comparable to that of commercial pyroelectric detectors but smaller than that observed with passive thermistors due to the 1/f noise in the active PMOS thermistor and heat balancing heater.

Figure 12:
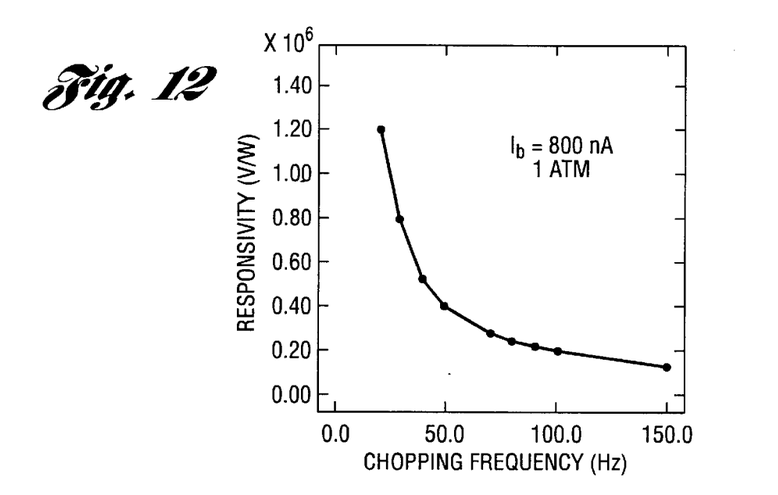
FIG. 12 is a graph of responsivity vs. chopping frequency at a bias current of 800 nA.

FIG. 12 shows the responsivity as a function of frequency at a bias current of 800 nA. The responsivity decreased roughly inversely proportional to the frequency due to the thermal pole as well as capacitive loading at the detector output.

The detector response was next measured in a vacuum environment at 650 mT. An increased responsivity 2–3 times higher than that observed at atmospheric conditions was observed. This behavior is consistent with a reduction on the heat loss and a corresponding increase in the loop gain. The spectral response of the detector to different wavelengths was next measured by placing an IR monochromator (Scientific Measurement Systems MonoSpec 18) between the light source and the detector. The detector response was next normalized to that of the calibration detector. The responsivity shows absorption peaks near 3 and 6 $\mu$m as well as an onset of strong adsorption starting at about 8 $\mu$m consistent with the absorption of SiN passivation.

Figure 13:
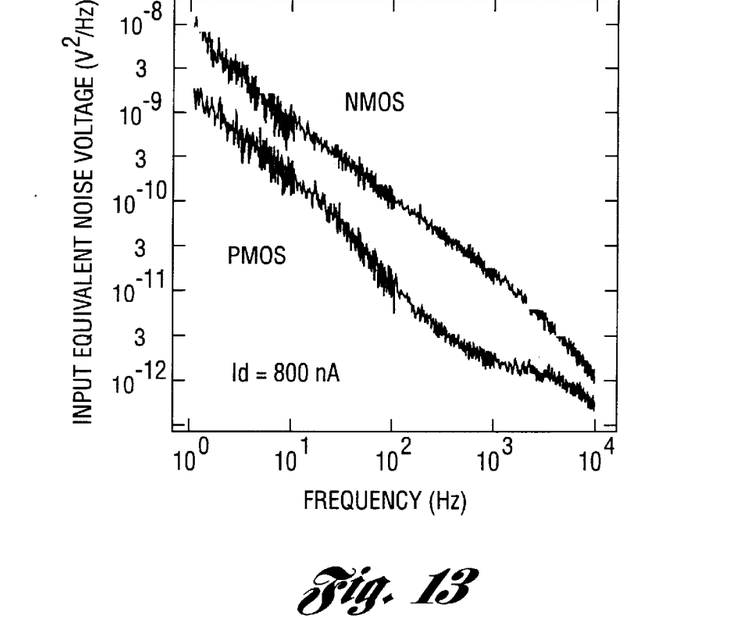
FIG. 13 are graphs of PMOS and NMOS input referred equivalent noise voltage vs. frequency.

The input referred noise equivalent voltages of both NMOS and PMOS devices were also measured using a prior art method shown in FIG. 13. The plots yield $K_f$ of 6.6×10$^{-27}$ and 0.3×10$^{-26}$ A F, respectively. This permits the calculation of the expected detectivity.

The calculated detectivity D* using Equations (19) and (14) with a detector area of 28×42 $\mu$m$^2$ was D*=8×10$^7$ cm $\sqrt{Hz}$ W$^{-1}$ at 30 Hz in reasonable agreement with the measurements. The detectivity can be significantly increased if the area of the NMOS current source devices is enlarged because M4–M5 contribute about 4 times more noise power than the suspended PMOS M1. This suggests that detectivities in the 10$^8$ cm $\sqrt{Hz}$ W$^{-1}$ range are achievable.

Performance Comparison

Table 1 compares the detector parameters to those of other commercial available infrared detectors.

TABLE 1

Performance Comparison

| PRINCIPLE | $\mu$bolometer[1] bolometer | P-42[2] pyroelectric | 2M[3] thermopile | Active Pixel heat-balancing |
|---|---|---|---|---|
| R (V/W) | 1 × 10$^7$ | 7 × 10$^3$ | 1.92 × 10$^1$ | 1 × 10$^6$ |
| NEP (W/$\sqrt{Hz}$) | 30p | 2n | 12.8n | 0.3n |
| D*(cm $\sqrt{Hz}$/W) | 5 × 10$^8$ | 2 × 10$^7$ | 2.9 × 10$^8$ | 3 × 10$^7$ |
| f (Hz) | NA | 15 | NA | 30 |
| AREA ($\mu$m$^2$) | 2.5 × 10$^3$ | 8 × 10$^5$ | 4 × 10$^6$ | 1.06 × 10$^4$ |

[1]Raytheon Sensors and Communications Systems, El Segundo, CA, U.S.A.
[2]Molectron Detector, Inc., Portland, Oregon, U.S.A.
[3]Dexter Research, Inc., Dexter, Michigan, U.S.A.

Compared to the most sensitive imaging-quality microbolometer, the heat balancing detector of the present invention has a comparable responsivity but a higher noise originated from the active devices. However, the fabrication cost for the active pixel device is much lower due to its implementation within a conventional CMOS process. When compared to a non-imaging commercial pyroelectric detector, the heat balancing detector has much higher responsivity and about the same noise floor. In general, the heat balancing detector's performance falls between the micro-bolometer and pyroelectric detector making it suitable for low cost, low-resolution imaging applications.

An 8×8 CMOS Infrared Imager

A Single Pixel Design For 8×8 Infrared Imager

Figure 14:
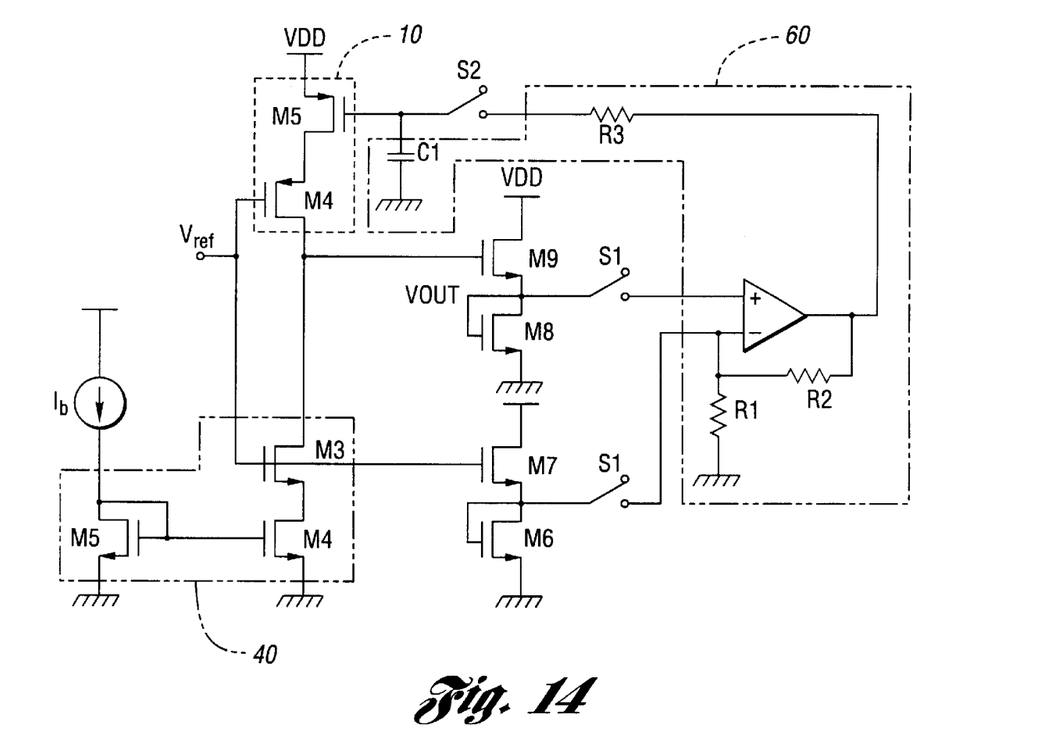
FIG. 14 is a schematic view of a single pixel detector circuit of the invention.

A simple 8×8 infrared imager was implemented using heat balancing detector pixels. This single pixel detector circuit used is shown in FIG. 14. The basic pixel configuration was very similar to the circuit shown in FIG. 8 and includes the thermally isolated plate 10, current control circuit 40, and a filter circuit 60 external to the chip. Each pixel consists of a bias control circuit, buffers, switches, and the external low pass filter 60. MOS switches S1 and S2 are used to control the inputs to an external low pass filter 60 that determines the bias voltage on the gate of M1 in standby mode. In the measure mode, this voltage is stored in capacitor C1. The external low pass filter 60 was implemented using a low noise chopper stabilized operational amplifier (LTC1053 from Linear Technology).

Figure 15:
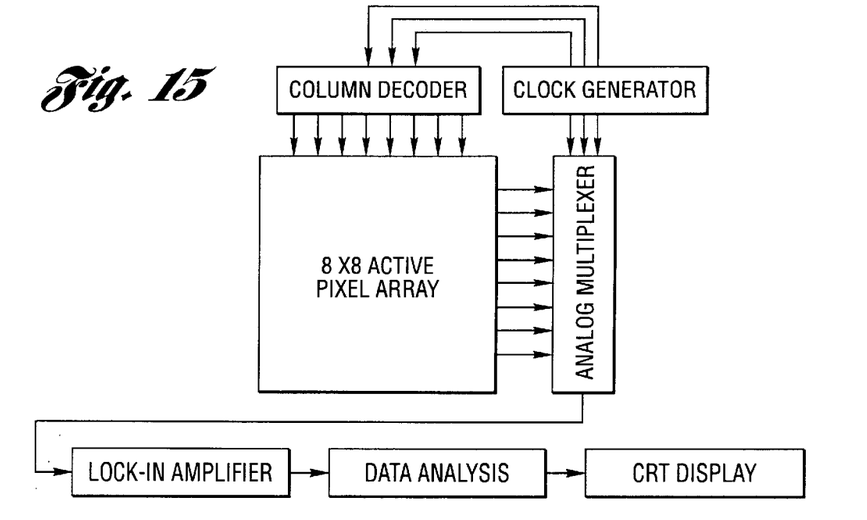
FIG. 15 is a schematic block diagram of an 8×8 active imager array of the present invention.

FIG. 15 shows the imager organization. The chip consists of a 8×8 active pixel imager array, a 3×8 column decoder, a clock signal generator, and one 8×1 analog multiplexer. The output signal of the chip is measured using an external locking amplifier controlled by a personal computer. Each row has a separate bias stabilization circuit which is shared by all the eight columns. Therefore, prior to reading each column, the bias voltage across capacitors $C_1$ must be refreshed. Six different clocking signals which are exact multiples of base clocking period (500 ms, 1 s, 2 s, 4 s, 8 s and 16 s) are generated using a pulse generator and multiplier. These signals drive the three signal inputs of column decoder and three row selection signals in analog multiplex. Therefore, a full scan of the whole imager takes 32 seconds to complete.

Figure 16:
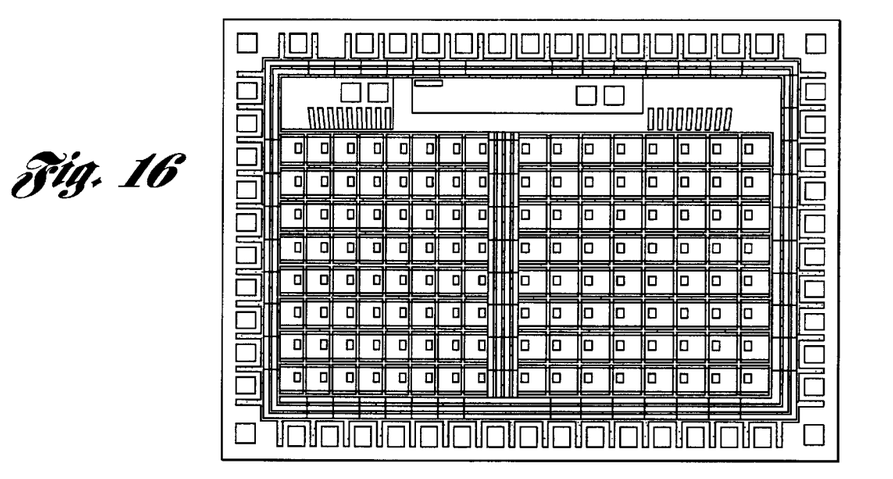
FIG. 16 is a top plan schematic view of two 8×8 CMOS active-pixel imagers of the present invention.
Figure 17:
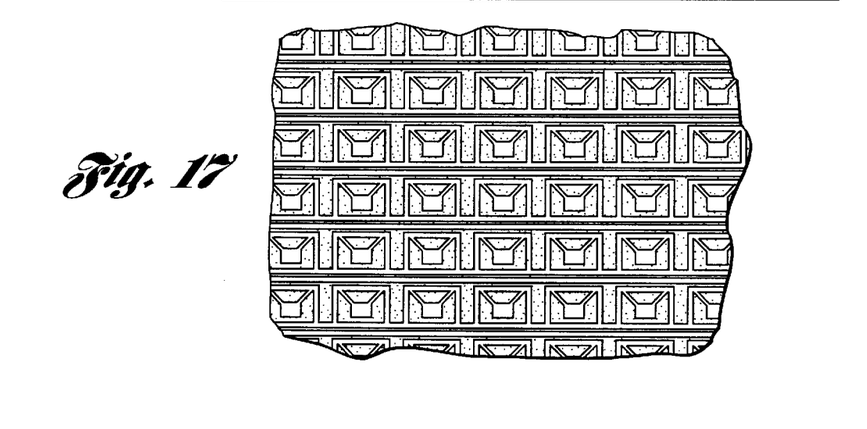
FIG. 17 is an enlarged view, partially broken away, of SEM of one of the imagers and showing pyramidal grooves etched under the suspended well by a silicon etch.

The imager was fabricated using MOSIS 1.2 μm HP standard CMOS process followed by the post-processing pixel release. Several modifications were introduced to the pixel that improve the fabrication yield. Each individual pixel is suspended by two (rather than four) beams in a Y shape configuration. This layout reduces the etching time and improves the etching uniformity across the entire imager because it provides a larger opening for the etchant. The interconnection on the suspension beams was implemented using metal rather than polysilicon which does not require a good passivation coverage because it is not attacked by the TMAH solution. These modifications improve the fabrication yield at the expense of a lower fill factor (about 11%) and a lower thermal resistance. All the pixel n-wells were connected together to a common bias line during the etch to ensure equal biasing potentials. FIG. 16 shows the top view of two 8×8 imagers. The imager on the left is 1.7×1.1 mm² including the column decoder and sixty four single pixels. The imager on the right includes the biasing stabilization circuit in each pixel hence requiring a larger area.

Testing

Figure 18:
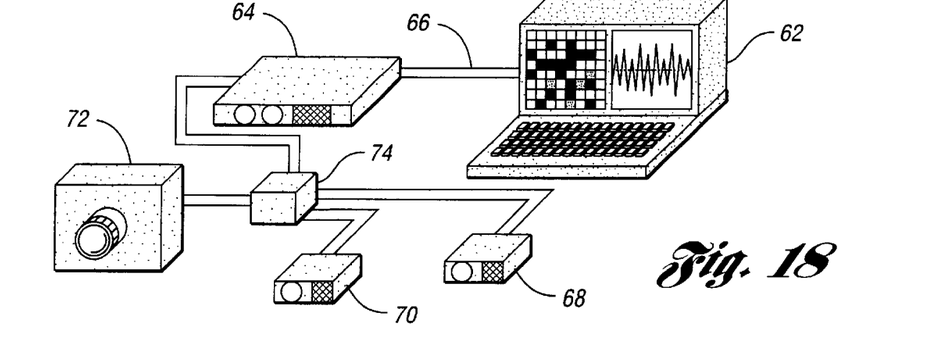
FIG. 18 is a schematic view of an imager testing setup.

In order to test the infrared imager, a set up using an incandescent light source, collimated lens, silicon wafer and glass wafer with aluminum pattern to perform the primary testing was constructed. An incandescent lamp enclosed inside a box was used with a small opening as a point source. The point source was located 38 cm away from the collimated lens approximately a paraxial light source. A silicon wafer was used to filter out any optical signal with wavelength lower than 1.2 μm. An infrared camera system using the same set up is constructed as shown in FIG. 18 and included a visual basic program control and computer monitor display 62 coupled to a lock-in amplifier 64 via an RS 232 cable 66. The system also included a chopper controller 68, a clock signal generator 70 and an imager and lens 72 all interconnected by a PCB interface circuit box 74. To properly focus the infrared signal, a convex germanium (Ge) lens (f/1.0) with 5 cm focal length was used. The distance between the infrared imager and the focusing lens was set up to form a 1.9×1.9 mm² imager for any object radiating heat placed between the near point (68 cm) to infinity. A MIKRON M305 stable black body light source heated at 500 K was placed 1.2 meters away to calibrate the responsivity and NETD of this imager. The imager was mounted on one X-direction and one Y-direction micromanipulator which precisely adjusted the location of the imager. A six inch aluminum optical chopper was mounted in front of the Ge lens.

Figure 19:
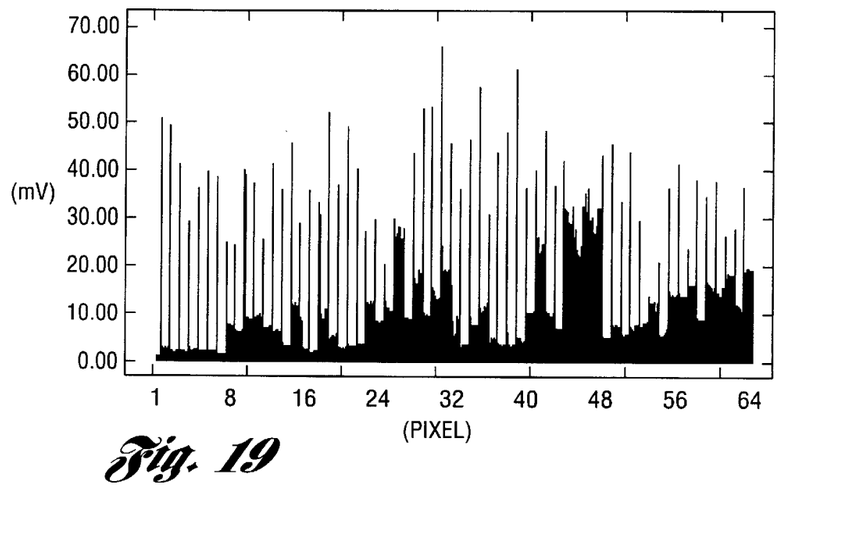
FIG. 19 is a graph of pixel number vs. RMS amplitude of a typical output waveform from a lock-in amplifier.
Figure 20:
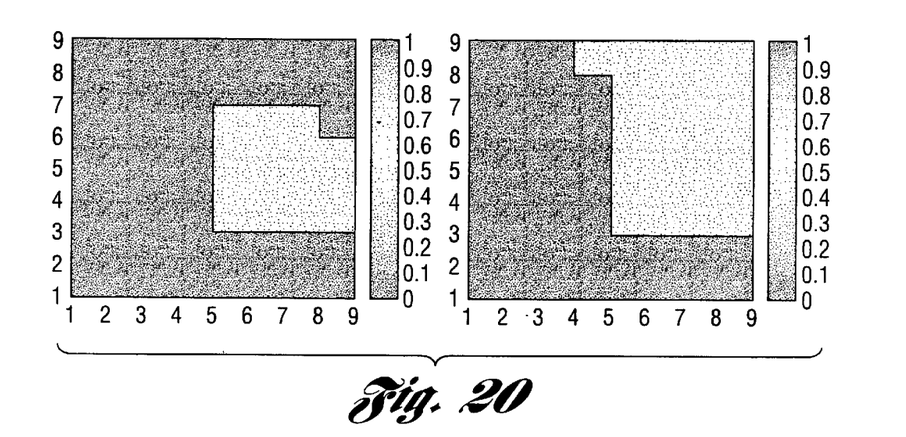
FIG. 20 shows plots of imager response to C- and L-shaped test patterns.

FIG. 19 shows a typical output waveform from the lock-in amplifier 64. The x-axis stands for the pixel number and y-axis is the RMS amplitude of the signal in the same frequency as the optical chopper. The switching transients were also recorded between pixel signals. Pixel numbers 1–8 have weaker signals than pixel numbers 43–48. FIG. 20 shows plots of the imager response to C- and L-shaped test patterns.

While the best mode for carrying out the invention has been described in detail, those familiar with the art to which this invention relates will recognize various alternative designs and embodiments for practicing the invention as defined by the following claims.

What is claimed is:

1. An uncooled infrared focal plane imager comprising:
 a plurality of microelectromechanical infrared detectors disposed in a plane wherein each of the infrared detectors includes:
   a substrate;
   a sensor positioned in an area thermally isolated from the substrate for sensing temperature and to provide a corresponding temperature signal representing incident power of infrared energy; and
   a heater for controllably hearing the sensor based on the temperature signal, wherein a change in incident power of the infrared energy is substantially balanced by a corresponding change in heat generated by the heater to heat the sensor; and
 a signal processor for processing the temperature signals from the infrared detectors to obtain an infrared image.

2. The imager as claimed in claim 1 wherein the heater is a circuit element.

3. The imager as claimed in claim 2 wherein the circuit element is a MOSFET.

4. The imager as claimed in claim 1 wherein the substrate is a semiconductor substrate.

5. The imager as claimed in claim 1 wherein the sensor is a thermistor element.

6. The imager as claimed in claim 5 wherein the thermistor element is a MOSFET.

7. The imager as claimed in claim 1 further comprising a comparator for comparing the temperature signal with a reference temperature signal and providing an output signal based on the comparison wherein the heat generated by the heater is based on the output signal.

8. The imager as claimed in claim 1 further comprising a support structure for supporting the sensor and the heater in spaced relationship from the substrate.

9. The imager as claimed in claim 1 wherein the sensor and the heater are PMOS devices.

10. The imager as claimed in claim 1 wherein the sensor and the heater comprise stages of a cascade amplifier.

11. A microelectromechanical infrared detector comprising:
 a substrate;
 a sensor positioned in an area thermally isolated from the substrate for sensing temperature and to provide a corresponding temperature signal representing incident power of infrared energy; and
 a heater for controllably heating the sensor based on the temperature signal, wherein a change in incident power of infrared energy is substantially balanced by a corresponding change in heat generated by the heater to heat the sensor.

12. The detector as claimed in claim 11 wherein the heater is a circuit element.

13. The detector as claimed in claim 12 wherein the circuit element is a MOSFET.

14. The detector as claimed in claim 11 wherein the substrate is a semiconductor substrate.

15. The detector as claimed in claim 11 wherein the sensor is a thermistor element.

16. The detector as claimed in claim 15 wherein the thermistor element is a MOSFET.

17. The detector as claimed in claim 11 further comprising a comparator for comparing the temperature signal with a reference temperature signal and providing an output signal based on the comparison wherein the heat generated by the heater is based on the output signal.

18. The detector as claimed in claim 11 further comprising a support structure for supporting the sensor and the heater in spaced relationship from the substrate.

19. The detector as claimed in claim 11 wherein the sensor and the heater are PMOS devices.

20. The detector as claimed in claim 11 wherein the sensor and the heater comprise stages of a cascade amplifier.

* * * * *